United States Patent [19]

Lieu

[11] Patent Number: 5,023,565

[45] Date of Patent: Jun. 11, 1991

[54] LINEAR AMPLIFIER WITH AUTOMATIC ADJUSTMENT OF FEED FORWARD LOOP GAIN AND PHASE

[75] Inventor: Winston H. Lieu, Parsippany, N.J.

[73] Assignee: AT&T Bell Laboratories, Murray Hill, N.J.

[21] Appl. No.: 470,672

[22] Filed: Jan. 26, 1990

[51] Int. Cl.⁵ .............................................. H03F 1/32
[52] U.S. Cl. .................................... 330/151; 330/149; 328/162
[58] Field of Search ............... 330/149, 151, 279, 302, 330/107, 129; 328/162

[56] References Cited

U.S. PATENT DOCUMENTS

| 4,879,519 | 11/1989 | Myer | 330/149 |
| 4,916,407 | 4/1990 | Olver | 330/151 |

Primary Examiner—Steven Mottola
Attorney, Agent, or Firm—A. G. Steinmetz

[57] ABSTRACT

A linear amplifier includes a feed forward circuit which is operative to eliminate distortion of the amplified signal by utilizing a second circuit path parallel to the amplification path to generate a distortion cancellation signal and combine it with the output of the amplification path to cancel the distortion. The gain and phase of the feed forward circuit is automatically adjusted by discrete steps through the operation of a stored program controller. The initial adjustment step is set at some minimum discrete value and its effect on the cancellation level of the feed forward circuit is evaluated. If the cancellation level does not change by a specified amount the adjustment step is increased by a discrete amount. Adjustment of the cancellation level is continued by discrete steps under control of the stored program control until a desired cancellation level is achieved. The number of step adjustments permitted is preset at some value. If the allotted number of step adjustments fail to achieve the desired response, the stored program control checks for the existence of possible fault conditions in the feed forward circuit.

3 Claims, 6 Drawing Sheets

LINEAR AMPLIFIER WITH AUTOMATIC ADJUSTMENT OF FEED FORWARD LOOP GAIN AND PHASE

FIELD OF THE INVENTION

This invention relates to high power linear amplifiers and more particularly to automatic control systems employing feed forward circuitry to reduce amplifier distortion. It relates particularly to adjusting gain and phase of the feed forward circuitry.

BACKGROUND OF THE INVENTION

RF linear amplifiers utilize devices that exhibit non-linear characteristics at higher power levels thereby resulting in the introduction of signal distortions. If more than one signal is applied to a linear amplifier, its non-linear characteristics cause an unwanted multiplicative interaction of the signals being amplified and the amplifier output contains intermodulation products. These intermodulation products cause interference and crosstalk over the amplifier frequency operating range which interference may exceed established transmission standards.

As is well known, intermodulation distortion can be reduced by negative feedback of the distortion components, predistorian of the signal to be amplified to cancel the amplifier generated distortion or by separating the distortion component of the amplifier output and feeding forward the distortion component to cancel the distortion in the amplifier output signal. Of these techniques, the forward feed approach provides the most improvement. Forward feed, however, is the most difficult to apply since it requires modifying the separated distortion component in amplitude and phase to match the gain and phase shift of the amplifier on a continuous basis.

U.S. Pat. No. 4,885,551 (assigned to same assignee as this application) discloses a linear amplifier having a feed forward circuit used for cancellation of distortion in the amplification circuitry. To accomplish this cancellation operation, adjustment of amplitude and phase parameters of the feed forward circuit is performed by a stored program controller. Adjusement in the gain and phase of the feed forward path is made by comparing a carrier detected signal amplitude to a previous signal amplitude and selecting one of three step size adjustments for further adjustment depending on a calculated DB level representing the difference.

SUMMARY OF THE INVENTION

A linear amplifier includes a feed forward circuit operative to eliminate distortion of the amplified signal by utilizing a second circuit path parallel to the amplification path to transfer the input signal without distortion and combine it with the output of the amplification path to form a signal representative of the distortion in the amplification path. Its amplitude and phase is modified so that it may be subtracted from the output of the amplification path to cancel the distortion component. The gain and phase of the feed forward circuit is automatically adjusted by sequential discrete steps through the operation of a stored program controller. The initial adjustment step is set at some minimum discrete value and its effect on the cancellation level of the feed forward circuit is evaluated. If the cancellation level does not change by a specified amount the adjustment step is increased by a discrete amount. The effects of this new adjustment step on the cancellation level is evaluated again. This continues unitl the cancellation level changes by more than the specified amount or the number of times the adjustment step has increased exceeds a present value. Adjustment of the cancellation level is continued by discrete steps under control of the stored program control until a desired cancellation level is achieved. If the maximum step adjustments fails to achieve the desired response, the stored program control checks for the existence of possible fault conditions in the feed forward circuit.

DETAILED DESCRIPTION

Figure 1:
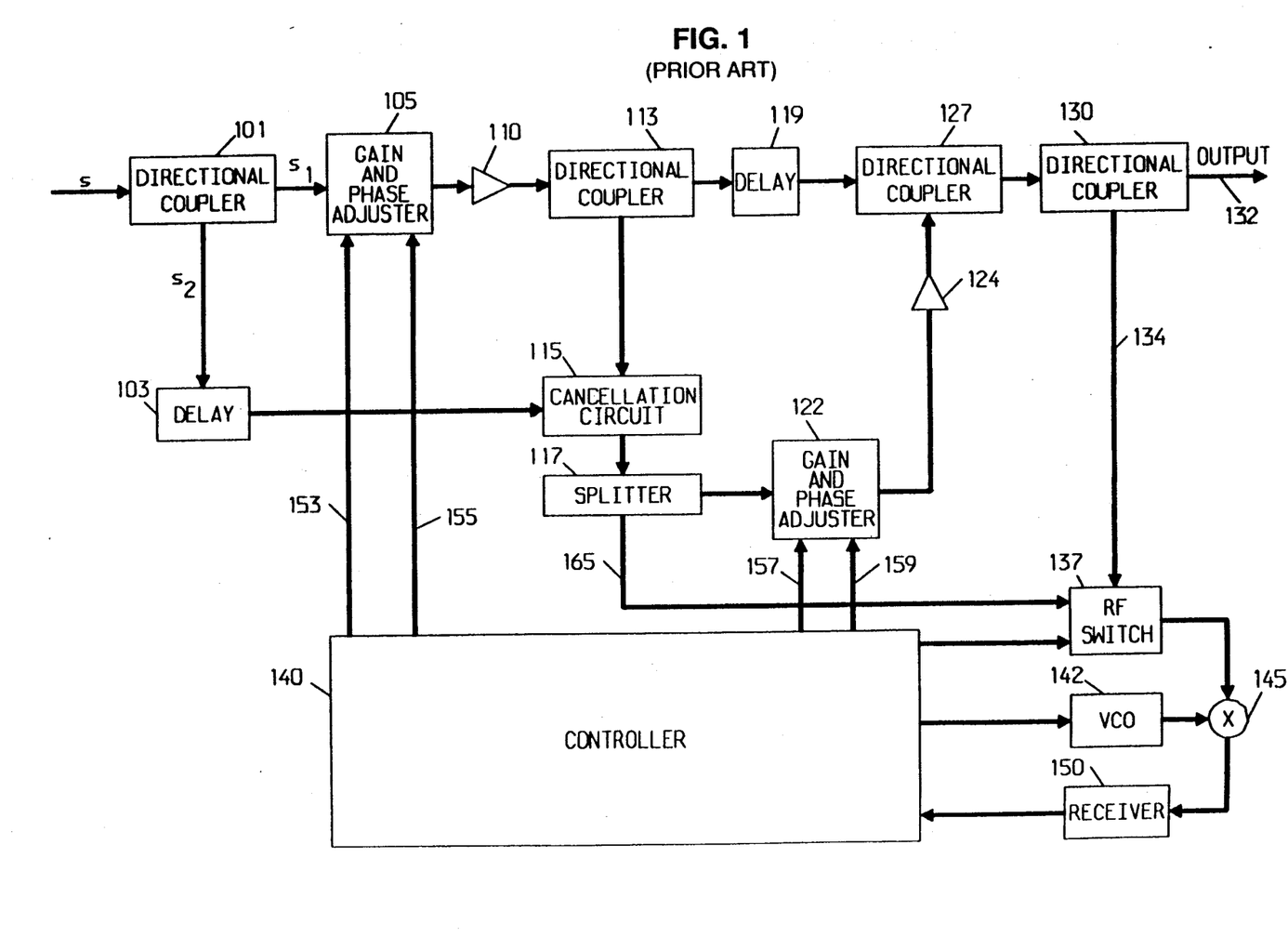
FIG. 1 shows a general block diagram of an amplifier using a carrier signal for forward feed distortion correction.

FIG. 1 depicts a forward feed amplifier that is operative to amplify signals across a prescribed frequency band. Referring to FIG. 1, a composite input signal which may comprise a plurality of signals across the prescribed band is divided into two portions $s_1$ and $s_2$ by directional coupler 101. The amplitude and phase of signal $s_1$ is modified in amplitude and phase adjuster 105, amplified in main amplifier 110, and directed to the output 132 through directional coupler 113, delay 119, directional couplers 127 and 130. Distortion and intermodulation product components may be added by power amplifier 110 as aforementioned which distortion must be removed from the signal appearing at output 132.

Signal $s_2$ is delayed in delay circuit 103 and applied to one input of cancellation circuit 115 without any distortion being introduced. Directional coupler 113 splits the signal from power amplifier 110 and supplies a portion of the power amplifier output to the other input of cancellation circuit 115. The signal from directional coupler 113 has a distortion and intermodulation product component but the signal from delay 103 is clean i.e., substantially free of any distortion. The clean signal from delay 103 is subtracted from the distorted amplifier output signal in cancellation circuit 115. If the amplitude and phase of the power amplifier input is properly adjusted, the amplified signal from the directional coupler 113 is cancelled by the clean signal from delay 103. As a result, only the distortion and intermodulation component appears at the cancellation circuit output.

A portion of the distortion component from cancellation circuit 115 is passed through signal splitter 117, amplitude and phase adjuster 122 and correction amplifier 124 into directional coupler 127 wherein it is subtracted from the output of the power amplifier applied via directional coupler 113 and delay 119. The time delay of delay 119 is set to compensate for the signal delay through the path including signal splitter 117, amplitude and phase adjuster 122 and auxiliary amplifier 124. Consequently, the output signal from directional coupler 127 has all or a substantial portion of the distortion from the power amplifier removed.

Figure 6:
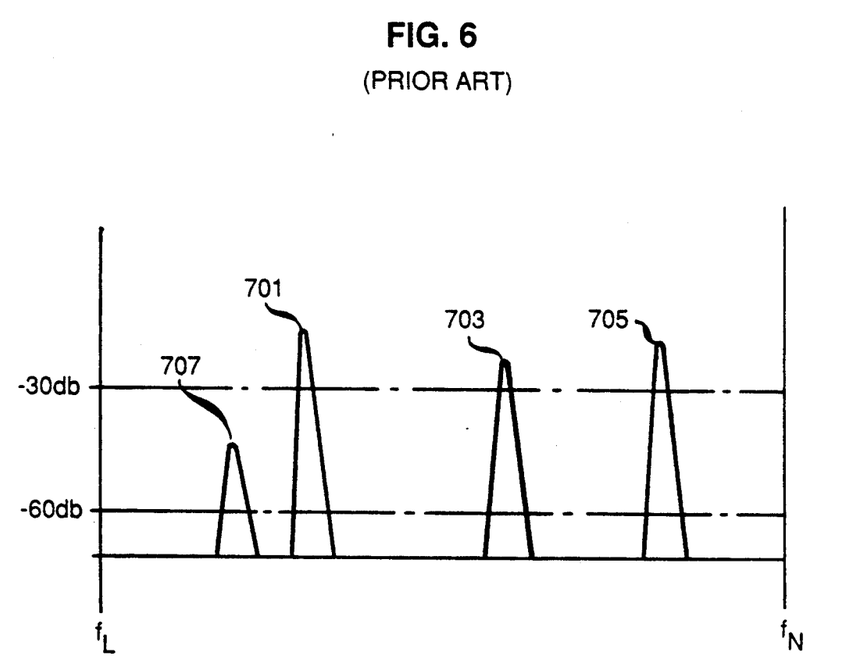
FIG. 6 shows waveforms illustrating the operation of the circuit of FIG. 1 in the amplifier frequency spectrum.

In order to assure maximum distortion removal, the distortion signal must be measured and amplitude and phase adjusters controlled to reduce the distortion. FIG. 6 illustrates the frequency band of the circuit of FIG. 1. Carrier signals shown in waveforms 701, 703 and 705 have amplitudes greater than $-30$ db and an intermodulation distortion product signal 707 has an amplitude between $-30$ and $-60$ db. In accordance with the invention, controller 140 is operative to scan output 132 from one end, e.g., $f_L$, of the prescribed frequency band of the circuit of FIG. 1 to locate carrier signal $S_c$ (waveform 701). Once the carrier signal is located, the magnitude of the carrier signal from cancellation circuit 115 is supplied to the controller via narrow band receiver 150 and the amplitude and phase parameters of amplitude and phase corrector 105 are iteratively modified by the controller to drive the carrier signal component of the output of the cancellation circuit to a minimum. This amplitude and phase adjustment assures that output of the cancellation circuit has the maximum carrier signal reduction. It is also necessary to minimize the intermodulation product component of the power amplifier output. In accordance with the invention, the prescribed frequency band is again scanned from end $f_L$ in FIG. 6 to detect the intermodulation product signal of waveform 707. Once the intermodulation product signal is found, the parameters of amplitude and phase adjuster 122 are iteratively modified by controller 140 to minimize the intermodulation product signal appearing on lead 134 from directional coupler 130. Advantageously, it is not necessary to remove a portion of the prescribed frequency band from service in order to insert a pilot signal for distortion reduction.

Figure 2:
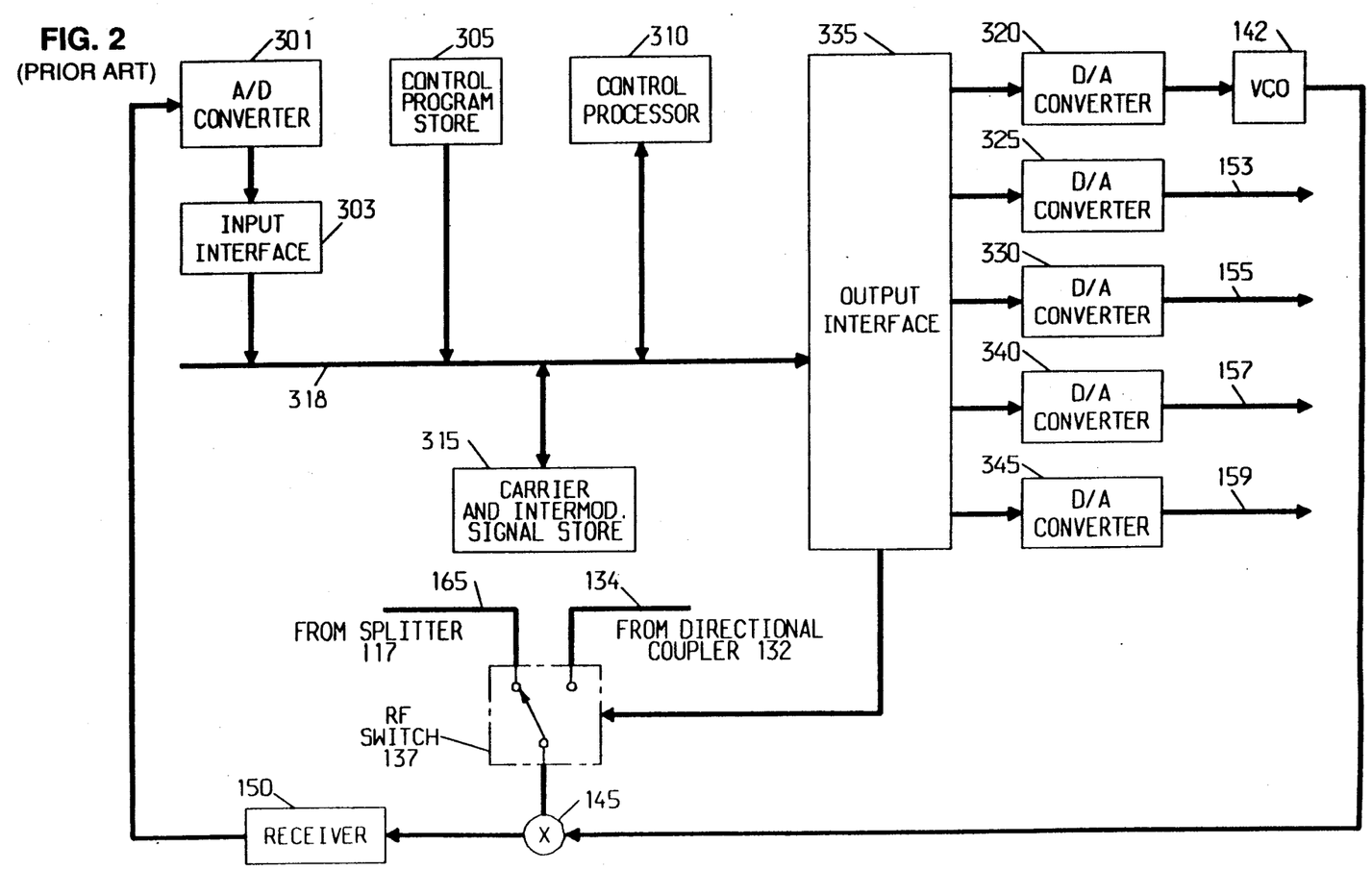
FIG. 2 shows a more detailed diagram of the controller used in the circuit of FIG. 1.

Controller 140 is shown in greater detail in FIG. 2. The circuit of FIG. 2 comprises a signal processor arrangement such as the Intel type D87C51 microprocessor and includes control program store 305, control processor 310, carrier and intermodulation signal store 315, input interface 303, output interface 335 and bus 318. Analog-to-digital converter 301 receives signals representative of the magnitude of signals from receiver 150 and converts the analog signal into a series of digital values. Control processor 310 operating in accordance with instructions stored in control program store 305 causes these digital values to be sent to store 315 via input interface 303 and bus 318. The processor also provides digital signals to digital-to-analog converters 320, 325, 330, 340, and 345 via bus 318 and output interface 335. The analog output of converter 320 is supplied to voltage controlled oscillator (VCO) 142 to direct scanning operations. The output of converters 325 and 330 are sent to the amplitude adjustment control and the phase adjustment control of amplitude and phase adjuster 105 via leads 153 and 155 to modify the adjuster's amplitude and phase characteristics, respectively. The outputs of converters 340 and 345 are sent to amplitude and phase adjuster 122 via leads 157 and 159 to modify its amplitude and phase parameters. Interface 335 is also connected to the control lead of RF switch 137 to determine its position during the control operations.

Prior to the start of operation of the circuit of FIG. 1, amplitude and phase adjusters 105 and 122 are manually trimmed to optimum settings. Controller 140 is adapted to maintain optimum operation over time under varying conditions. Amplitude and phase adjuster 105 modifies the amplitude and phase characteristics of the circuit path including power amplifier 110 so that the amplifier output signal is cancelled by the undistorted input signal from delay 103. Controller 140 is first connected to directional coupler 130 by RF switch 137 and directs the scanning of the frequency spectrum of the signal therefrom through VCO 142, mixer 145 and narrow band receiver 150 in FIG. 1 to detect a carrier. It is then connected to splitter 117 at the output of cancellation circuit 115 and the amplitude and phase parameters of adjuster 105 are adjusted to minimize the magnitude of the carrier appearing on lead 165. After the carrier component is minimized or a preset number of adjustments are made, the controller operates to scan the prescribed frequency band from end $f_L$ on lead 134 to detect an intermodulation signal and makes a sequence of adjustments of the amplitude and phase parameters of adjuster 122 to reduce the intermodulation signal on lead 134 below a prescribed threshold. The controller continuously cycles through parameter adjustment of amplitude and phase adjusters 105 and 122.

Figure 3:
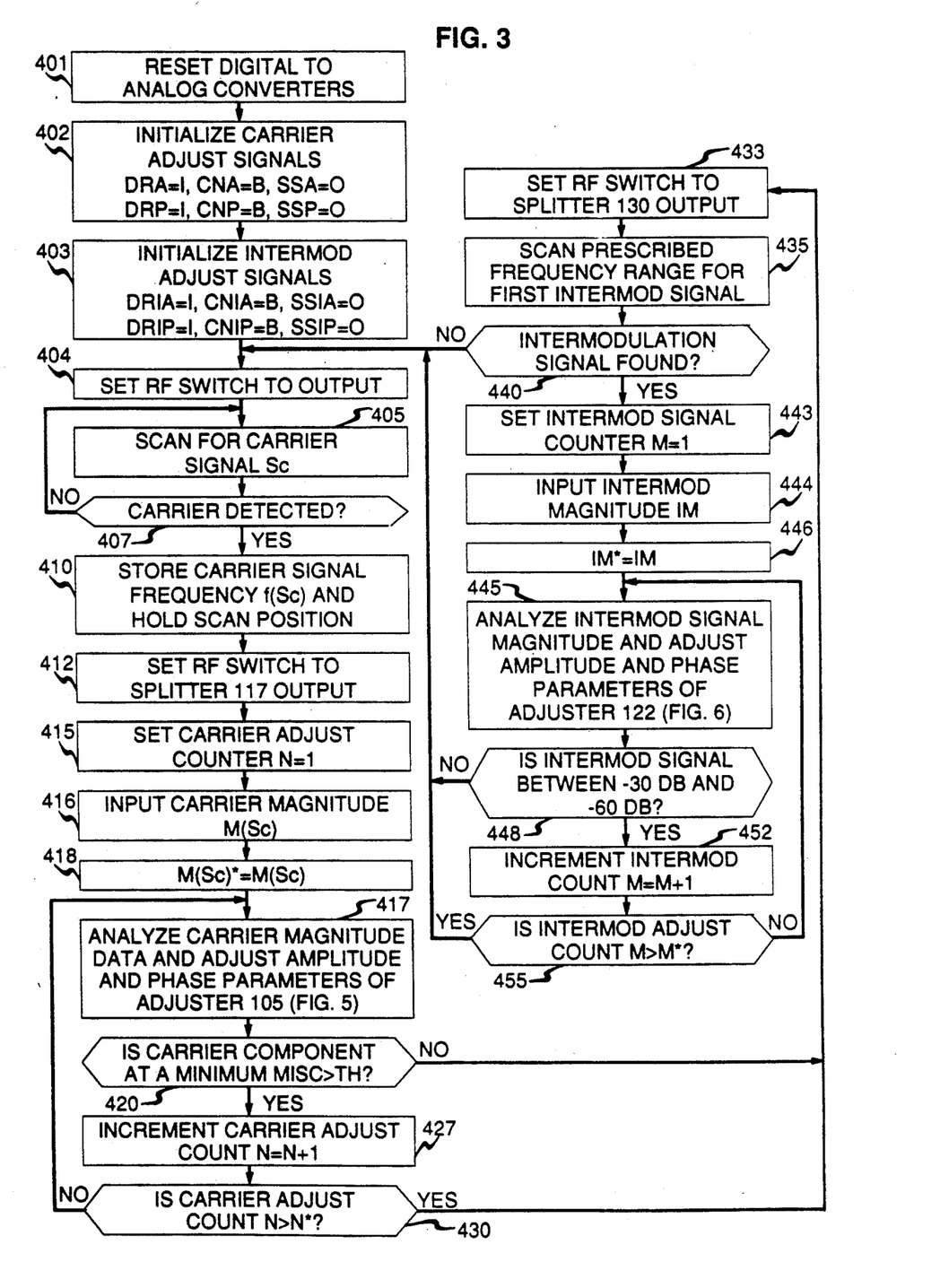
FIGS. 3, 4 and 5 are flow charts illustrating the operation of the controller for the amplifier of FIG. 1.

The operation of the controller of FIG. 2 is directed by instructions permanently stored in control program store 305. FIG. 3 is a flow chart illustrating the operation of the controller 140 in accordance with the instructions stored therein. With reference to FIGS. 2 and 3, control processor 310 initially resets digital to analog converters 320, 325, 330, 340 and 345 as per program step 401. Carrier adjustment control signals and the intermodulation adjustment control signals are the initialized in steps 402 and 403 and RF switch 137 is set to receive the signal on lead 134 (step 404). At this time, VCO circuit 142 is set by digital-to-analog converter 320 to be at the $f_L$ end of the prescribed frequency range of the amplifier. RF switch 137 is set to couple lead 134 to one input of mixer 145 and VCO 142 is coupled to the other input of mixer 145. In the loop from step 405 to step 407, the prescribed frequency band is scanned (step 405) until a carrier signal is detected at lead 134 (step 407). Signals obtained at narrow band receiver 150 during the scan are applied to analog-to-digital converter 301 in FIG. 3 and stored by the control processor in data store 315. Upon detection of a carrier signal by the control processor, the carrier signal amplitude and frequency are stored and the scan frequency of VCO 142 is maintained (step 410).

Processor 310 sends a signal to RF Switch 137 to change its position to couple the distortion signal from splitter 117 to mixer 145 (step 412). At this time, the signal on lead 165 corresponding to the detected carrier is applied from receiver 150 to analog to digital converter 301. A signal N which counts the number of carrier signal adjustments is then set to one (step 415). The carrier magnitude M(Sc) is acquired (step 416) and it is assigned the designation M(Sc)*(step 418). The carrier signal adjustement loop from step 417 to step 430 is entered. During the iterative detected carrier signal adjustment, the parameters of amplitude and phase adjuster 105 are modified to minimize the carrier signal observed by the control processor. The loop is iterated until the carrier signal falls below a predetermined threshold or until a preset number of adjustments have been made.

In the carrier adjustment loop, the carrier signal at splitter 117 is applied to analog-to-digital converter 301 via RF switch 137, mixer 145 and receiver 150. The carrier magnitude data is analyzed and adjustments are made to the amplitude and phase parameters of adjuster 105 (step 417). The magnitude of the carrier signal $M(S_c)$ is compared to the predetermined threshold in decision step 420 by processor 310. Until the carrier magnitude is less than the threshold TH, the loop is iterated. In each iteration, the magnitude of the carrier signal from splitter 117 is compared to a threshold value (step 420). If the magnitude of the carrier signal at splitter 117 is less than the threshold value, e.g., −30 db, the carrier component in the output of cancellation circuit 115 in FIG. 1 is determined to be acceptable, control is passed to step 433 and the intermodulation signal reduction is started. Where the magnitude is equal to or greater than the threshold value TH, the carrier adjustment count is incremented (step 427) and compared to a predetermined number N* (step 430). If N* is exceeded, the iterations are terminated and the intermodulation product signal reduction is begun in step 433. The operations of data analysis step 417 are shown in greater detail in the flow chart of FIG. 4.

Figure 4:
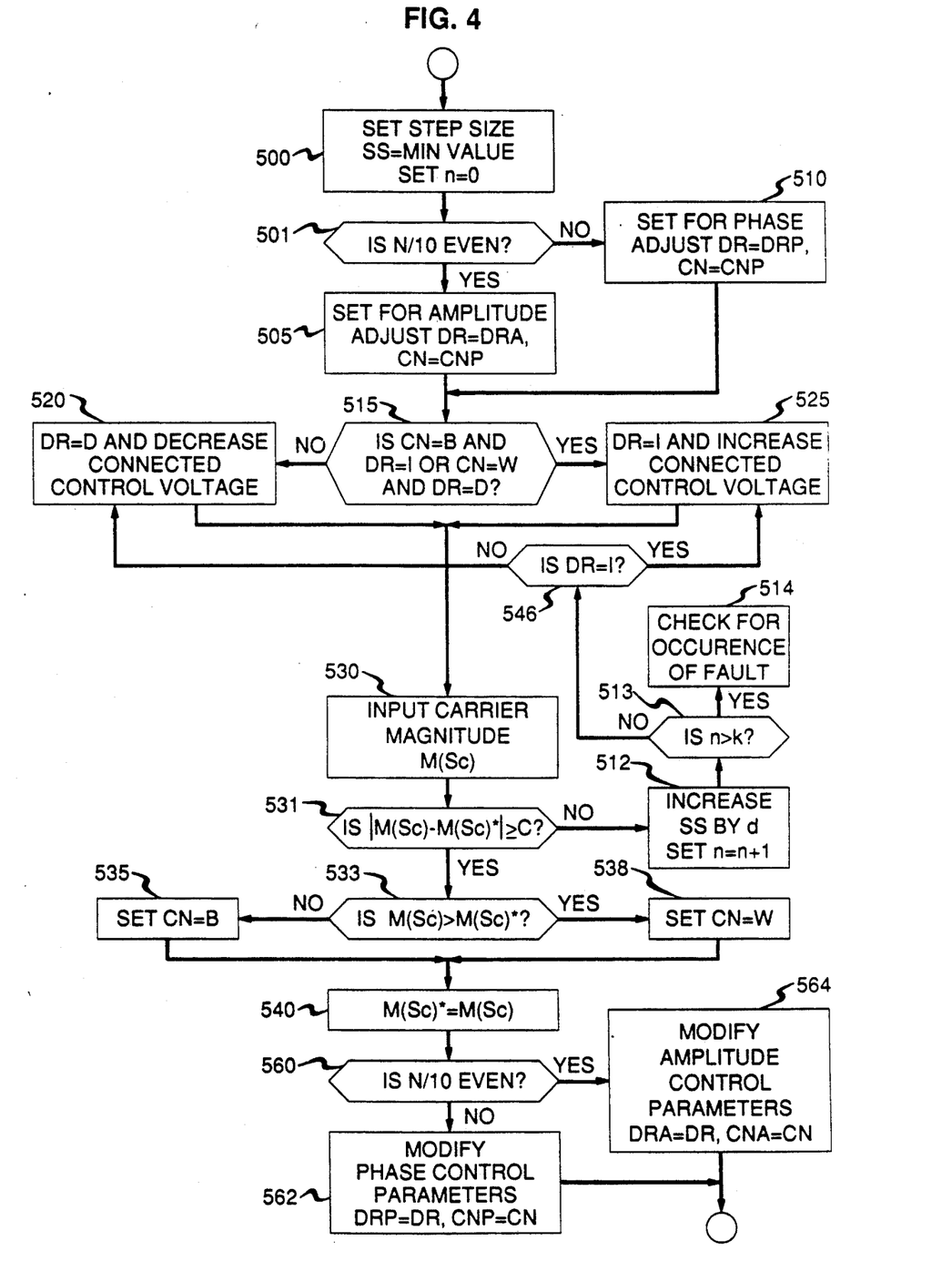

The flow process of FIG. 4 is entered from step 415 or step 430 of the flow chart shown in FIG. 3. The flow process of FIG. 4 determines the level of adjustment of the amplitude and phase parameter of adjuster 105. Step 500 presets a step size of adjustment by setting a step size signal to some minimum value. Decision step 501 is invoked to determine whether the amplitude or phase parameter is to be adjusted in the current iteration. This is done by dividing the adjustment count signal N by 10. If the result is even, the control signals DR and CN are set to the amplitude adjustment values DRA and CNA in step 505. Otherwise, the adjustement control signals DR and CN are set to DRP and CNP for phase adjustment in step 510. Assume for purposes of illustration that amplitude adjustment is selected. The direction of charge control signal DR is initially set to the value, i.e., I (increase) or D (decrease), obtained in the last iteration. The condition control signal is set to either B (better) or W (worse) corresponding the corrective value of the last iteration.

Decision step 515 is then entered in which the control parameters are evaluated. If CN=B and DR=I or CN=W and DR=D indicating an improvement on increase or a worsening on decrease during the last iteration, control signal Dr is set to I and the control voltage on amplitude adjustment digital-to-analog converter 325 is increased by an amount corresponding to the initial setting of step size signal SS (step 525). In the event that the condition CN=B and DR=I or CN=W and DR=D is not satisfied, direction control DR is set to D and the control voltage on the amplitude adjustment converter is decreased by the amount corresponding to the last quantum step size SS (step 520).

After the adjustement of step 520 or step 525, the carrier detected signal amplitude M(Sc) is input from receiver 150 of FIG. 1 (step 530) and subtracted from the amplitude of the preceding iteration M(Sc)*(step 531) and compared to a value C. If the difference value is not greater than the value of C the step size is incremented by an amount d (step 542) and a counter recording the number of step adjustments n is incremental by 1. The count n is compared with a value K limiting the number of step adjustment (decision step 543). If the allowable number of step adjustments has been attained a check is made for the occurrence of a fault in the amplifier (step 544). Otherwise, the control flow signal is readjusted with the new step size. The readjustment of the control signal is accomplished by checking the DR flag (step 546). The control voltage is increased if DR=I and decreased if DR=D.

If the difference calculated in step 531 with or without the step size enlargement exceeds the present value C, the step adjusted signal is compared to the preceding iteration M(Sc)*(step 533). If M(Sc)≧M(sc)* the adjustment status is considered to have deteriorated and condition signal CN is set to W (step 538). Where M(Sc) is smaller than M(Sc)* this adjustment status is better and condition signal CN is set to B. M(Sc)* is then set to the current magnitude value M(Sc) in step 540 in preparation for the next iteration. The process continues, to step 560, which stores the value M(Sc). If N/10 is even for amplitude adjustment, step 564 is entered via decision step 560 and the updated parameters DR and CN are stored as signals DRA and CNA. If N/10 is odd, control parameters DR, CN and SS are stored as signals DRP and CNP in step 562. Processor control is then passed to step 420 in FIG. 4.

Where are signal N/10 is odd, the operation of the control processor is the same as previously described with respect to FIG. 4 except that condition control signal CNP and direction control signal DRP are obtained as indicated in step 510 and used as control signals CN and DR (Step 562). Processor control is then passed to step 420 in FIG. 3.

When the carrier processing loop of FIG. 3 is exited via decision step 420 or 430, processor 310 causes RF switch 137 to be repositioned so that lead 134 from directional coupler 130 is connected to one input of mixer 145 and the output of receiver 150 corresponds to the output signal at lead 134 (step 433). The controller is then conditioned to scan the frequency range of the amplifier from the same end used as the starting frequency of the carrier signal to search for an intermodulation product signal, e.g., signal between −30 db and +60 db (step 435). If such an intermodulation product signal is detected in step 440, the intermodulation count signal M is set to one (step 443). The intermodulation product amplitude is acquired and set to IM* (steps 444 and 446). Intermodulation adjustment loop from step 445 to step 455 is entered. Otherwise, the processor returns to step 404 so that the carrier scan process of steps 405 and 407 is restarted. In the intermodulation reduction loop, processor 310 analyzes the intermodulation signal magnitude IM and adjusts the amplitude and phase of adjuster 122 responsive thereto (step 445). After an adjustment is made to adjuster 122, the intermodulation signal IM is tested in decision step 448. If the magnitude IM is not between −30 and −60 db, processor control is passed to step 404 and the carrier signal search loop is reentered. When the IM signal is between −30 and −60 pl db, another iteration of the intermodulation reduction loop is needed and intermodulation count signal M is incremented (step 452). The incremented value is compared to maximum count signal M* (step 455) and the loop is reentered in step 445. If the magnitude IM is greater than −30 db, the detected signal may not be an intermodulation signal and control is returned to step 404. Where IM is below −60 db, the value is acceptable and step 404 is reentered. The intermodulation reduction loop may be exited from either decision steps 448 or 455.

Figure 5:
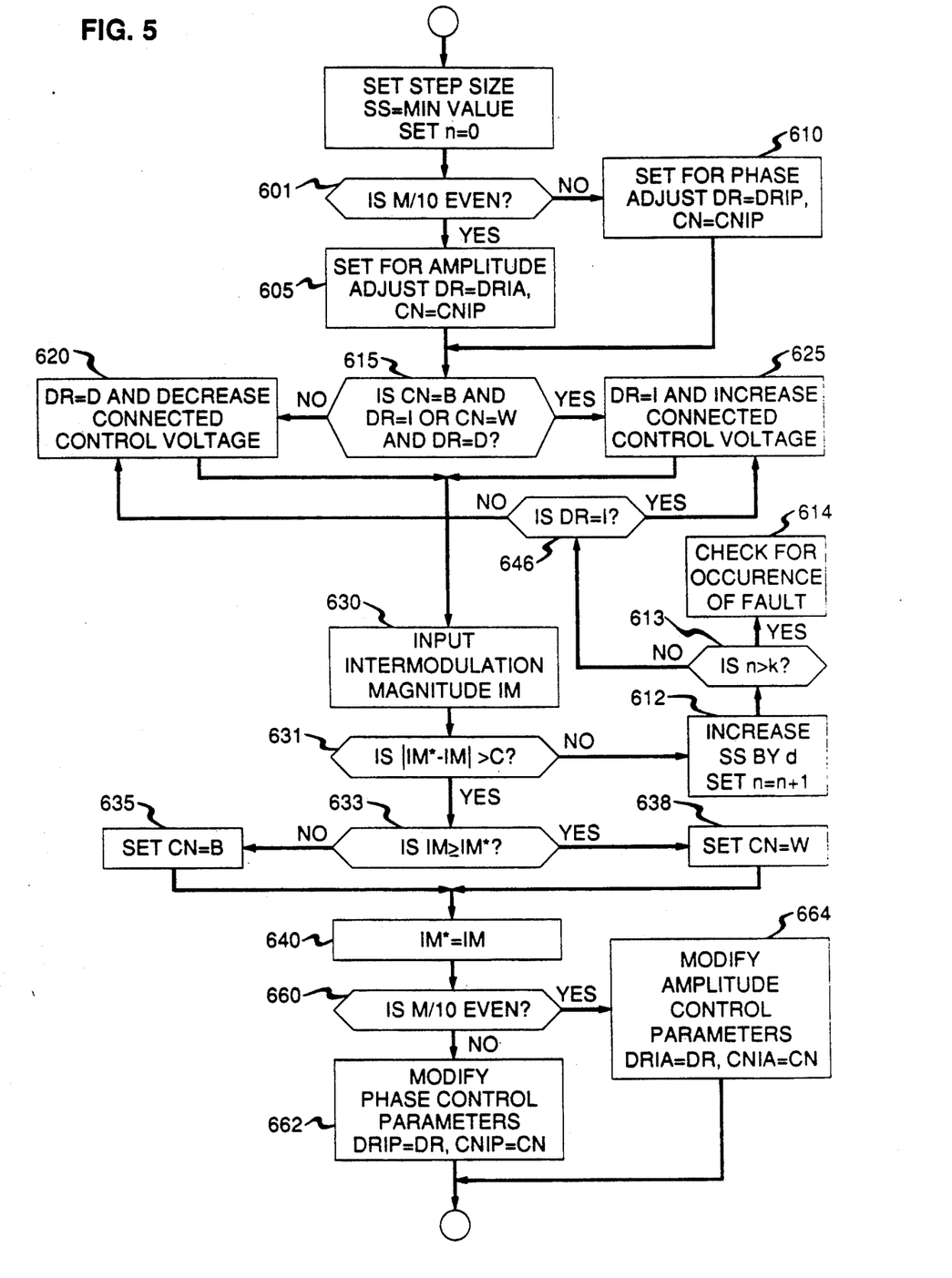

The intermodulation signal analysis and adjustment step 445 is shown in greater detail in FIG. 5. Referring to FIG. 5, the analysis involves separate adjustment of the amplitude and phase parameters of adjuster 122. The flow process of FIG. 5 is entered into from step 443 or 455 in FIG. 3 in order to determine the adjustment of an amplitude or phase parameter. The adjustment step size is preset to some minimum value in step 600 and a count variable n is set to zero. Decision step 601 is operative to determine whether the amplitude or the phase parameter is to be adjusted in the current iteration. This is done by dividing the adjustment count signal M by 10. If the result is even, the control signals for the adjustments DR and CN, are set to previous intermodulation values DRIA and CNIA in step 605. Otherwise the adjustment control signals DR and CN, are set to previous intermodulation values DRIP and CNIP in step 610. Assume for purposes of illustration that amplitude adjustment is selected. The direction of change control signal DR is initially set to the value, i.e., I (increase) or D (decrease), obtained in the last iteration. The condition signal is set to either B (better) or W (worse) corresponding the corrective value of the last iteration.

Decision step 615 is then entered wherein the control parameters are evaluated. If CN=B and DR=I or CN=W and DR=D indicating an improvement on increase or a worsening on decrease during the last iteration, control signal DR is set to I and the control voltage on amplitude adjustment digital-to-analog converter 340 is increased by an amount corresponding to the setting of step size signal SS (step 625). In the event that the conditions CN=B and DR=I or CN=W and DR=D is not satisfied, direction control DR is set to D and the control voltage on the amplitude adjustment converter is decreased by the amount corresponding to the last iteration step size SS (step 620).

After the adjustment of step 620 or step 625, the intermodulation signal amplitude IM is input from receiver 150 of FIG. 1 (step 630) and compared to the amplitude of the preceding iteration IM* (step 631).

If the difference value is less than C then step size SS is incremented by the value d (step 642) and a counter recording the number of step adjustments n is incremented by 1 (step 642). The count n is compared with a limit value k (step 643) to limit the number of permissible adjustments. If the limit k has been reached, a check is made for the occurrence of a fault in the amplifier (step 644). If further step adjustments are required, the control signal is readjusted with the new step size. The readjustment of the control signal is implemented by checking the DR value (step 646). If DR=I, the control voltage is increased and if DR=W the control voltage is decreased.

If the difference value calculated in step 631 with or without the step size enlargement exceeds the preset value C the step adjustment signal is compared to the preceding iteration IM* (step 633). If IM ≧IM* the adjustment status is concluded to have deteriorated and condition signal CN is set to W (step 638). Where IM is smaller than IM* the adjustement status is considered good and a condition signal CN is set to B (step 638). IM* is then set to the current magnitude value IM in step 640 in preparation for the next iteration. The process continues to step 660.

Where the signal M/10 is odd, the operation of the control processor is the same as previously described with respect to FIG. 6 except that condition control signal CNIP and direction control signal DRIP are obtained as indicated in step 610 and used as control signals CN and DR. Maximum adjustment count signal M* may be set to a value such as 10 so that the control processor adjusts one of the amplitude and phase parameters of adjuster 105 ten times and then adjusts the other of the amplitude and phase parameters 10 times or until the conditions of step 448 are met.

When the data analysis and comparison of steps 445 and 448 are completed, intermodulation count M is incremented (step 452) and the count is compared to the maximum allowable count M(Sc)* in decision step 455. If M>M*, step 403 is reentered to begin the carrier signal search operations. Where M≦M* in step 455, the next iteration is then started in step 445. The iterations are ended when the intermodulation product signal is outside the 31 30 to +60 db range set in decision step 448 or the iterations time out in step 455 because count signal M>M*. As a result of the intermodulation reduction loop operation, the intermodulation distortion is reduced by readjusting the parameters of amplitude and phase adjuster 122 until an acceptable level of intermodulation distortion is obtained.

The invention has been described with reference to illustrative embodiments thereof. It is apparent, however, to one skilled in the art that various modifications and changes may be made without departing from the spirit and scope of the invention.

I claim:

1. An amplifier circuit, comprising:
an input and an output,
an amplification path interconnecting the input and the output,
a feed forward path coupled to the input and the output and operative for compensating distortion introduced into the amplification path, including;
means for generating a correction signal in the feed forward path representative of distortion in the amplification path, and having;
means for adjusting a phase and amplitude of the correcting signal in quantized steps,
means for adjusting the magnitude of the quantized steps;
wherein the improvement comprises;
means for setting an initial quantized signal step magnitude,
means for comparing a difference between a signal of a previous correction to a present signal with a preset value,
means for adjusting the signal step magnitude from the initial quantized step signal magnitude by a fixed value if the difference is less than the preset value,
means for establishing a count,
means for decrementing the count in response to each adjustment of the step signal magnitude,
means to terminate the adjustment when the established count is attained, and
means for checking for the occurence of a fault when the established count is attained.

2. An amplifier, including:
amplification circuitry,
a feed forward circuit shunting the amplification circuitry,
means for adjusting the feed forward circuit to cancel distortions in the amplification circuitry,
means for quantizing the adjusting of the feed forward circuit,
wherein the improvement comprises:
means for assigning an initial step size of adjustment a minimum value,
means for comparing a previous amplifier signal with a present amplifier signal and comparing a difference between them to a present amplifier signal and comparing a difference between them to a preset value, means for increasing the step size of adjustment by a discrete value if the difference is less than preset value, means for counting a number of adjustements, means for terminating increasing of a step size of adjustment when a specified count threshold is attained, and means for initiating a fault condition check when the specified count threshold is attained.

3. An amplifier circuit, comprising:

an amplification stage, a feed forward circuit for compensating distortion in the amplification stage, including means for generating a signal representative of distortion in the amplification stage, and having means for adjusting an amplitude and phase of the signal representation of distortion, and means for combining an output of the means for adjusting with an output of the amplification stage, wherein the improvement comprises:

means for quantizing adjustment of the means for adjusting, comprising:

means for setting a minimum adjustment step, means for determining an effect of a previous adjustment step has attained a preset magnitude, means for increasing the adjustment step by a fixed quanta level in response to the means for determining if the preset magnitude is not attained, means for limiting increases in the adjustment to a preset number of times, and means for checking for the occurences of a fault condition if the preset number is attained.

* * * * *